United States Patent
Tsukizawa

(10) Patent No.: US 8,076,985 B2
(45) Date of Patent: Dec. 13, 2011

(54) PLL/FLL WITH VOLTAGE CONTROLLED OSCILLATOR

(75) Inventor: Takayuki Tsukizawa, Osaka (JP)

(73) Assignee: Panasonic Corporation, Osaka (JP)

( * ) Notice: Subject to any disclaimer, the term of this patent is extended or adjusted under 35 U.S.C. 154(b) by 35 days.

(21) Appl. No.: 12/727,513

(22) Filed: Mar. 19, 2010

(65) Prior Publication Data

US 2010/0244968 A1   Sep. 30, 2010

(30) Foreign Application Priority Data

Mar. 31, 2009   (JP) ................................ 2009-087038

(51) Int. Cl.
*H03L 1/00* (2006.01)

(52) U.S. Cl. .............. 331/176; 331/117 R; 331/117 FE; 331/167; 331/177 V

(58) Field of Classification Search .............. 331/177 V, 331/176, 117 R, 117 FE, 167
See application file for complete search history.

(56) References Cited

U.S. PATENT DOCUMENTS 7,336,138 B2 * 2/2008 Kitamura et al. ............. 331/186

FOREIGN PATENT DOCUMENTS

| JP | 9-223929 | 8/1997 |
| JP | 10-126154 | 5/1998 |

* cited by examiner

*Primary Examiner* — Arnold Kinkead
(74) *Attorney, Agent, or Firm* — Wenderoth, Lind & Ponack, L.L.P.

(57) ABSTRACT

Provided is a voltage-controlled oscillator that can hold an oscillation frequency at a desired value when an oscillation frequency changes due to the temperature, without narrowing a variable range of the oscillation frequency, and a PLL circuit, an FLL circuit, and a wireless communication device, which use the voltage-controlled oscillator. A control voltage Vt is applied to a connection point Y between variable capacitors 121 and 122 included in a variable capacitance circuit 120. A control signal Fse1 is applied to a switching element 132 included in a capacitance switching circuit 130. A power-supply voltage Vdd is applied by a control section 170 to a connection point X between inductors 111 and 112 included in an inductor circuit 110. A voltage value of the power-supply voltage Vdd is controlled such that the oscillation frequency of the local oscillation signal is held at a constant regardless of a temperature change.

4 Claims, 14 Drawing Sheets

US 8,076,985 B2

PLL/FLL WITH VOLTAGE CONTROLLED OSCILLATOR

BACKGROUND OF THE INVENTION

1. Field of the Invention

The present invention relates to a voltage-controlled oscillator (VCO) that is used in a wireless communication device, and a PLL circuit, an FLL circuit, and a wireless communication device, all of which use the voltage-controlled oscillator.

2. Description of the Background Art

Conventionally, a voltage-controlled oscillator is widely used as a device for generating a local oscillation signal of a wireless communication device. FIG. 12 is a figure showing a configurational example of a conventional voltage-controlled oscillator. The voltage-controlled oscillator shown in FIG. 12 includes: two inductors 11 and 12; two variable capacitors 21 and 22; a switching element 32; two capacitive elements 31 and 33; two oscillation transistors 41 and 42; and a current source 50. A constant power-supply voltage Vdd is applied to a connection point between the inductors 11 and 12 by an LDO (low-dropout regulator). In addition, a control voltage Vt is applied to a connection point between the variable capacitors 21 and 22; and a control signal Fse1 is inputted into the switching element 32. This voltage-controlled oscillator changes the capacitance value of the whole voltage-controlled oscillator by controlling the control voltage Vt and the control signal Fse1. As a result, an oscillation frequency of the local oscillation signal outputted from the voltage-controlled oscillator changes. In FIG. 13, a solid line indicates a change in the oscillation frequency with respect to the control voltage Vt when the control signal Fse1 is LOW; and a dashed line indicates a change in the oscillation frequency with respect to the control voltage Vt when the control signal Fse1 is HIGH.

If a temperature change occurs while the voltage-controlled oscillator is in use, for example, the inductances of the inductors 11 and 12 change in association with the temperature change. As a result, the oscillation frequency of local oscillation signal fluctuates. A conceivable way to suppress such a fluctuation of the oscillation frequency is to sense the temperature of the voltage-controlled oscillator, and, depending on the result of the sensing, change the control voltage Vt within a variable range. Here, the variable range of the control voltage Vt shown in FIG. 13 is a range in which a value of the control voltage Vt can fall within, and a stable oscillation frequency characteristic cannot be obtained beyond this range. Known means for sensing the temperature of the voltage-controlled oscillator are those disclosed in Japanese Laid-Open Patent Publication No. H10-126154 (hereinafter, denoted as patent document 1) and Japanese Laid-Open Patent Publication No. 1109-223929 (hereinafter, denoted as patent document 2). As the means for sensing the temperature of the voltage-controlled oscillator, patent document 1 discloses a temperature compensation circuit that includes a resistance and an NTC thermistor, and patent document 2 discloses an NTC thermistor.

When a temperature change described above occurs, a temperature characteristic of the oscillation frequency will be one as shown in FIG. 14A. In FIG. 14A, a solid line indicates the oscillation frequency characteristic at a normal temperature, a dotted line indicates the oscillation frequency characteristic at a low temperature, and a dashed line indicates the oscillation frequency characteristic at a high temperature. Here, at a low temperature, suppose $f_0$ is selected as the oscillation frequency by configuring the control voltage Vt as VtA which is within the variable range. Next, when the temperature increases under this condition, it is necessary to change the control voltage Vt from VtA to VtB in order to hold the oscillation frequency at $f_0$. However, the oscillation frequency cannot be held at $f_0$ since VtB is a voltage value that is beyond the variable range of the control voltage Vt. Thus, in a case where the oscillation frequency changes due to the temperature, as shown in FIG. 14B, it is necessary to narrow an interval of a frequency band between an Fse1 at LOW and an Fse1 at HIGH, such that VtB will be in the variable range of the control voltage Vt. Therefore, with a method of holding the oscillation frequency by adjusting the control voltage Vt in response to a change of the inductance due to a temperature change, there is a problem where the variable range of the oscillation frequency becomes narrow.

SUMMARY OF THE INVENTION

Hence, an objective of the present invention is to provide a voltage-controlled oscillator that can hold an oscillation frequency at a desired value when the oscillation frequency changes due to the temperature, without narrowing a variable range of the oscillation frequency, and a PLL circuit, an FLL circuit, and a wireless communication device, all of which use the voltage-controlled oscillator.

In order to solve the above-described problem, one aspect of the present invention is a voltage-controlled oscillator that generates a local oscillation signal. This voltage-controlled oscillator includes: an inductor circuit; a variable capacitance circuit; at least one capacitance switching circuit; a negative resistance circuit; and a control section. The inductor circuit includes inductors that are connected in series. The variable capacitance circuit includes variable capacitors that are connected in series. Each of the variable capacitors changes its own capacitance value by using a difference in electrical potentials between both of its terminals. The capacitance switching circuit includes a capacitive element and a switching element. The inductor circuit, the variable capacitance circuit, the at least one capacitance switching circuit, and the negative resistance circuit are parallelly connected to each other. In this configuration, the control section applies a power-supply voltage to a connection point between the inductors. Furthermore, a control voltage is applied to a connection point between the variable capacitors, and a control signal is inputted into the capacitance switching circuit. The control section changes the power-supply voltage in association with a temperature change, so as to maintain the oscillation frequency of the local oscillation signal at a constant regardless of a temperature change.

With the above-described configuration, the oscillation frequency of the local oscillation signal is held at a constant regardless of a temperature change, due to a control of the power-supply voltage in association with the temperature change. Therefore, it is almost completely unnecessary to control the control voltage in response to a temperature change.

In another aspect of the present invention, the control section increases the power-supply voltage in association with an increase in the temperature.

If the temperature increases, for example, the inductance of the inductors increases, and as a result, the oscillation frequency of the local oscillation signal increases. The oscillation frequency depends on a product obtained by multiplying the inductance of the inductors by the capacitance value of the variable capacitance circuit and the capacitance switching circuit. With the above-described configuration, the capacitance value of the variable capacitors decreases so as to cancel out the increase in the inductance. As a result, the oscillation frequency of the local oscillation signal is held at a constant regardless of a temperature change.

In another aspect of the present invention, the control section includes: a storing section; a sensor; and a configuration section. The storing section stores a temperature and a voltage value in association with one another. The sensor senses a temperature. The configuration section retrieves, from the storing section, a voltage value that corresponds to a temperature that is sensed by the sensor, and configures the voltage value as the power-supply voltage.

By configuring a voltage value in the storing section to a proper value, a change of the oscillation frequency of the local oscillation signal in association with a temperature change can be easily suppressed.

In another aspect of the present invention, the temperature and the voltage value stored in the storing section are configured such that the voltage value becomes larger as the temperature becomes higher.

With the above-described configuration, an increase in the inductance is cancelled out by a reduction in the capacitance value of the variable capacitors, since the power-supply voltage will be configured to a larger value as the temperature sensed by the sensor becomes higher. As a result, an advantageous effect can be obtained in which the oscillation frequency of the local oscillation signal is held at a constant regardless of a temperature change.

In another aspect of the present invention, the control section is a low-dropout regulator that includes a resistance and a transistor. A resistance value of the resistance is configured such that the oscillation frequency is maintained at a constant regardless of a temperature change.

A conventional low-dropout regulator is configured such that a power-supply voltage is consistently maintained at a constant. A resistance has a positive characteristic in which a voltage value increases in association with an increase in the temperature. With the above-described configuration, the power-supply voltage will increase in association with an increase in the temperature due to the characteristic of a resistance, and as a result, the oscillation frequency is maintained at a constant regardless of a temperature change.

In another aspect of the present invention, the voltage-controlled oscillator includes a buffer amplifier that takes out an output of the voltage-controlled oscillator. In addition to the connection point between the inductors, the control section applies the power-supply voltage to the buffer amplifier.

With this, a constant output can be obtained from the voltage-controlled oscillator regardless of the temperature.

According to the present invention, the capacitance value of the voltage-controlled oscillator changes, as a result of a change in the difference in electrical potentials between both ends of the variable capacitor, due to a change of the power-supply voltage. Since the oscillation frequency is adjusted by this change in the capacitance value, the oscillation frequency can be held at a desired value when the oscillation frequency changes due to the temperature, without narrowing the frequency variable range.

These and other objectives, characteristics, aspects, and advantages of the current invention will be made obvious further by the following detailed description with reference to the attached drawings.

DESCRIPTION OF THE PREFERRED EMBODIMENTS

First Embodiment

Figure 1:
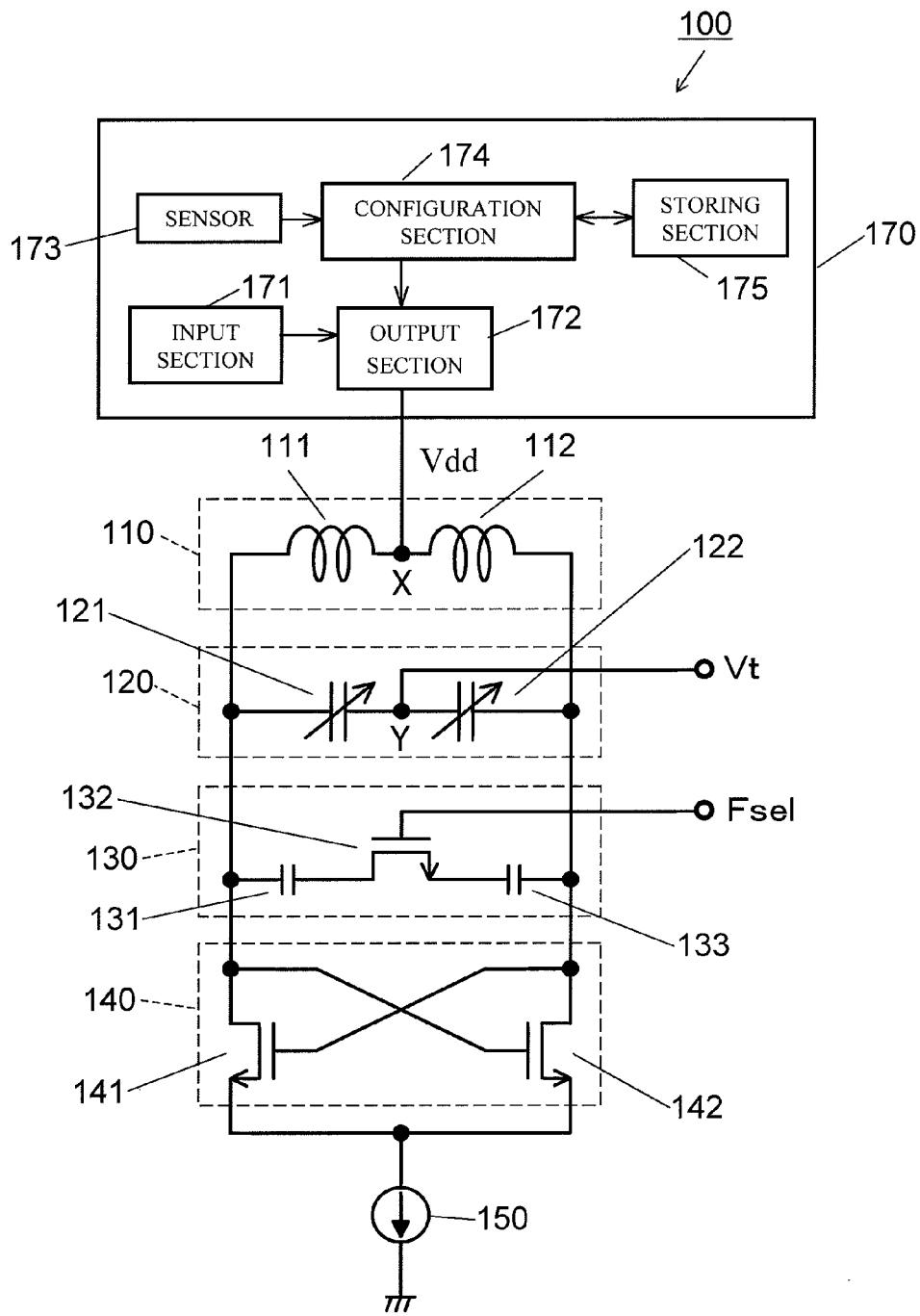
FIG. 1 is a figure showing a configurational example of a voltage-controlled oscillator 100 according to a first embodiment of the present invention.
Figure 2A:
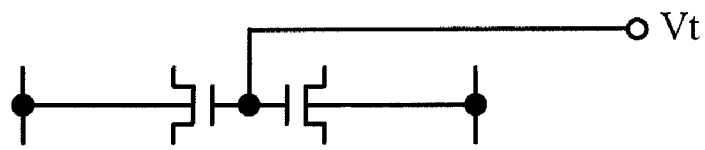
FIGS. 2A to 2D are figures showing alternate examples of a configuration of a variable capacitance circuit 120.
Figure 2B:
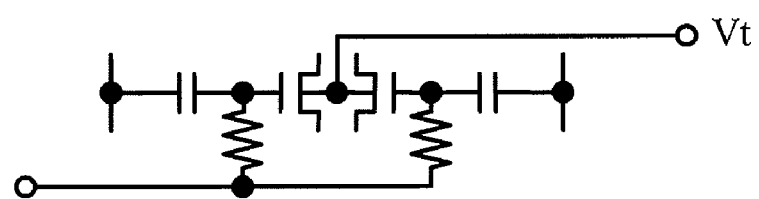
Figure 2C:
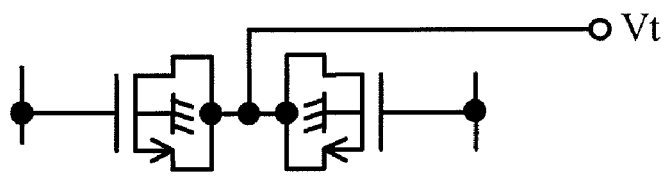
Figure 2D:
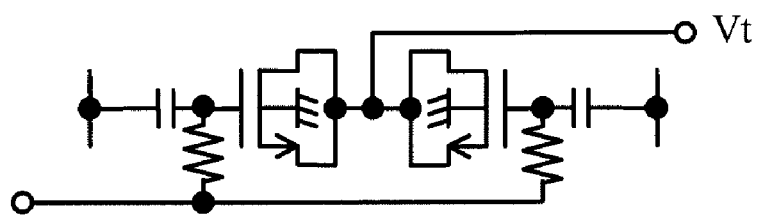

A first embodiment of the present invention will be described with reference to drawings as appropriate in the following. FIG. 1 is a figure showing a configurational example of a voltage-controlled oscillator 100 according to the first embodiment. The voltage-controlled oscillator 100 is a device that generates a local oscillation signal of a wireless communication device such as a mobile phone and the like. As shown in FIG. 1, the voltage-controlled oscillator 100 includes: an inductor circuit 110; a variable capacitance circuit 120; a capacitance switching circuit 130; a negative resistance circuit 140; a current source 150; and a control section 170. The inductor circuit 110, the variable capacitance circuit 120, the capacitance switching circuit 130, and the negative resistance circuit 140 are parallelly connected to each other. Described in the present embodiment is the voltage-controlled oscillator 100 having a configuration in which a single capacitance switching circuit 130. However, the voltage-controlled oscillator 100 may be provided with a plurality of capacitance switching circuits 120.

The inductor circuit 110 includes inductors 111 and 112, which are connected in series. A power-supply voltage Vdd is applied to a connection point X between the inductor 111 and the inductor 112 by the control section 170. A description of this power-supply voltage Vdd will be provided in the following.

The variable capacitance circuit 120 of the present embodiment includes variable capacitors 121 and 122, which are connected in series. The variable capacitors 121 and 122 are variable capacitors that use the gate capacity utilized in a CMOS process. Each of the variable capacitors 121 and 122 changes its own capacitance value by using a difference in electrical potentials between both of its terminals. Other than the configuration shown in FIG. 1 and the like, the variable capacitance circuit of the voltage-controlled oscillator according to the present invention may have configurations that use a MOS transistor of an inversion-type and an accumulation-type, and a capacitive coupling (FIG. 2A to FIG. 2D).

The capacitance switching circuit 130 includes a MOS transistor 132 and capacitive elements 131 and 133, as switching elements. The capacitive elements 131 and 133 are respectively connected to the drain and the source of the MOS transistor 132. The capacitance switching circuit 130 includes a band switching circuit.

The negative resistance circuit 140 has a configuration in which two transistors 141 and 142 are cross-coupled to each other. A MOS transistor, a bipolar transistor, and the like are used as the transistors 141 and 142.

In order to conduct a feedback control on an oscillation frequency of the local oscillation signal outputted from the voltage-controlled oscillator 100, a control voltage Vt is applied to a connection point Y between the variable capacitor 121 and the variable capacitor 122. Furthermore, a control signal Fse1 is applied to the gate of the MOS transistor 132, and by switching the control signal Fse1 between HIGH level and LOW level, a band of the oscillation frequency of the local oscillation signal changes. The power-supply voltage Vdd and the ground voltage (=0V) are respectively suitable as the HIGH level and the LOW level. As described above, the oscillation frequency of the local oscillation signal outputted from the voltage-controlled oscillator 100 can be changed by changing the control voltage Vt and the control signal Fse1.

The control section 170 controls the power-supply voltage Vdd that is applied to the connection point X. The control section 170 includes: an input section 171; an output section 172; a sensor 173; a configuration section 174; and a storing section 175.

The input section 171 outputs an input voltage that is inputted from a battery and the like to the output section 172. The output section 172 transforms the input voltage from the input section 171 into a voltage value configured by the configuration section 174, and applies a resulting voltage to the connection point X as the power-supply voltage Vdd. The sensor 173 senses the temperature in the periphery of the inductors 111 and 112. An NTC thermistor can be used as the sensor 173. However, other temperature sensing means may be used as the sensor 173. The storing section 175 stores a temperature and a voltage value in association with one another (refer FIG. 4). The configuration section 174 retrieves, from the storing section 175, a voltage value that corresponds to a temperature that is sensed by the sensor 173, and configures the voltage value as a voltage value of the power-supply voltage Vdd outputted from the output section 172.

An oscillation frequency $f_0$ of the local oscillation signal outputted from the voltage-controlled oscillator 100 can be represented by the following formula 1.

$$f_0 = \frac{1}{2\pi\sqrt{LC}} = \frac{1}{2\pi\sqrt{L(C_v + C_c)}} \quad \text{(Formula 1)}$$

In formula 1, L represents the inductance of the inductors 111 and 112, $C_V$ represents the capacitance value of the variable capacitors 121 and 122, and $C_C$ represents the capacitance value of the capacitive elements 131 and 133. Assume a case where a temperature change occurs and, for example, the capacitance value $C_V$ of the variable capacitors 121 and 122 and the capacitance value $C_C$ of the capacitive elements 131 and 133 did not fluctuate, whereas a value of the inductance L of the inductors 111 and 112 did fluctuate. Normally, the value of the inductance L increases in association with an increase in the temperature. Thus, as it is obvious from formula 1, the oscillation frequency $f_0$ decreases when the temperature increases. As obvious from formula 1, the capacitance value $C_V$ of the variable capacitors 121 and 122 can be decreased in order to suppress a fluctuation of the oscillation frequency $f_0$, which is due to the increase in the temperature. Each of the variable capacitors 121 and 122 changes its own capacitance value by using a difference in electrical potentials between both terminals. Therefore, controlling the difference in electrical potentials between both ends of the variable capacitors 121 and 122, which is a difference in electrical potentials between the control voltage Vt and the power-supply voltage Vdd, allows holding the control voltage Vt at a constant and reducing the capacitance value $C_V$ of the variable capacitors 121 and 122.

Figure 3:
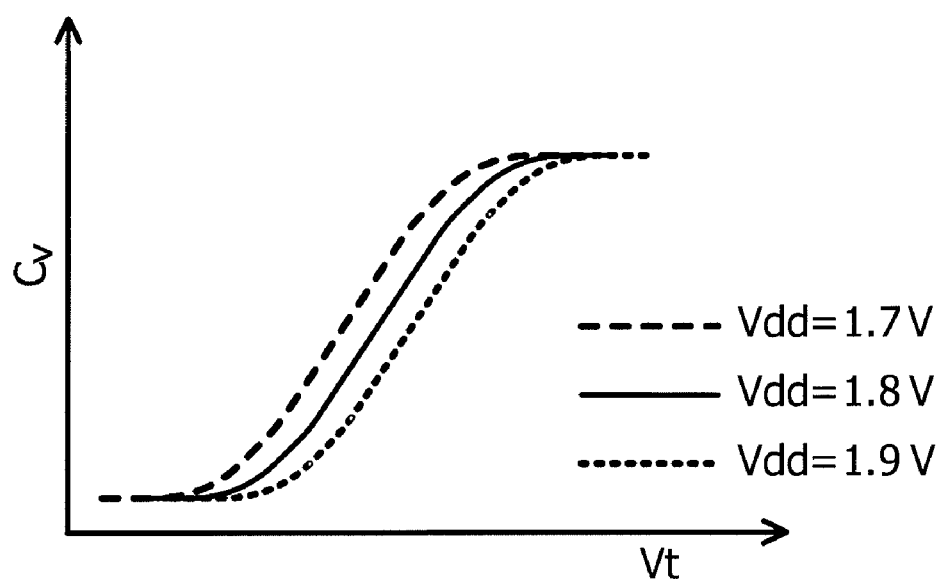
FIG. 3 is a figure showing a change in a capacitance value $C_V$ with respect to a control voltage Vt.

In FIG. 3: a change in the capacitance value $C_V$ with respect to the control voltage Vt when the power-supply voltage Vdd is 1.7 V is indicated by a dashed line; a change in the capacitance value $C_V$ with respect to the control voltage Vt when the power-supply voltage Vdd is 1.8 V is indicated by a solid line; and a change in the capacitance value $C_V$ with respect to the control voltage Vt when the power-supply voltage Vdd is 1.9 V is indicated by a dotted line. As obvious from FIG. 3, the capacitance value $C_V$ can be decreased without changing the control voltage Vt, by increasing the power-supply voltage Vdd. Therefore, the control section 170 controls the voltage value of the power-supply voltage Vdd such that a voltage value of the power-supply voltage Vdd increases in association with an increase in the temperature.

Figure 4:
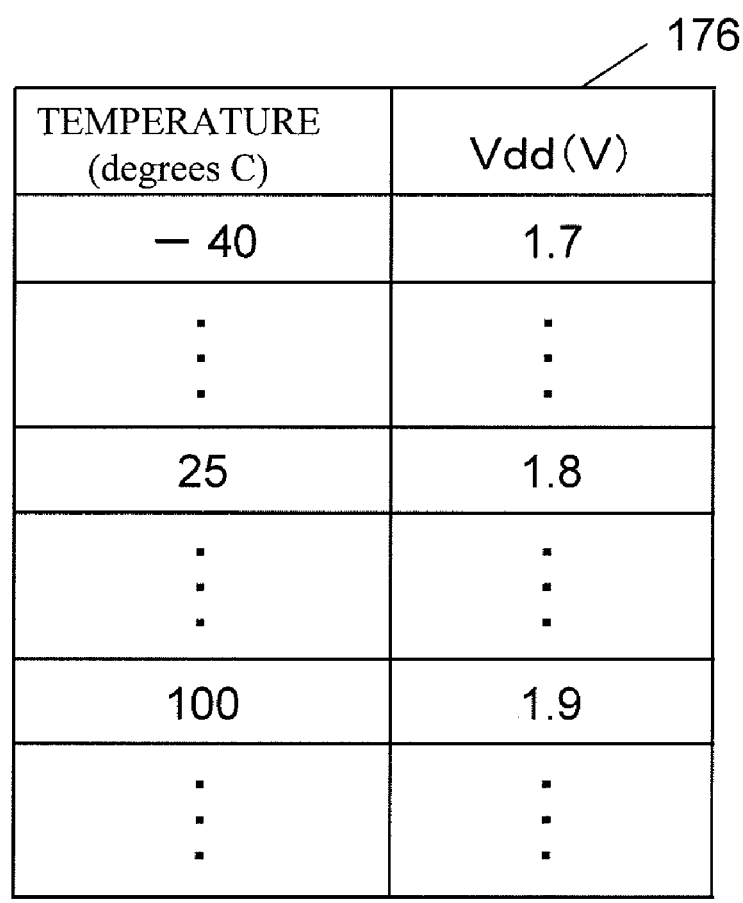
FIG. 4 is a figure showing a look-up table 176.

A control method of the power-supply voltage Vdd will be described in the following. FIG. 4 is a figure showing an example of a look-up table 176 stored in the storing section 175. The look-up table 176 allows the storing section 175 to store the temperature and the power-supply voltage Vdd in association with one another. The configuration section 174 retrieves, from the look-up table 176, a voltage value that corresponds to a temperature that is sensed by the sensor 173, and outputs the voltage value to the output section 172. Then, the output section 172 transforms the input voltage from the input section 171 into a voltage value outputted from the configuration section 174, and applies a resulting voltage to the connection point X as the power-supply voltage Vdd. Thus, the configuration section 174 retrieves, from the storing section 175, a voltage value that corresponds to a temperature sensed by the sensor 173, and configures the voltage value as a voltage value of the power-supply voltage Vdd.

For example: if the temperature sensed by the sensor 173 is −40° C., the power-supply voltage Vdd is configured to 1.7 V; if the temperature sensed by the sensor 173 is 25° C., the power-supply voltage Vdd is configured to 1.8 V; and if the temperature sensed by the sensor 173 is 100° C., the power-supply voltage Vdd is configured to 1.9 V. As described here, the voltage value stored in the look-up table 176 is configured to a proper value, so as to increase the power-supply voltage Vdd, which is configured by the configuration section 174, in association with an increase in the temperature.

As obvious from the description above, the capacitance value $C_V$ decreases as a result of the control section 170 increasing the power-supply voltage Vdd in association with an increase in the temperature. As a result, an increase in the inductance L in association with the increase in the temperature is offset by a decrease in the capacitance value $C_V$, and the oscillation frequency $f_0$ becomes constant regardless of the temperature change. In other words, even if a capacitance value or an inductance of a constituent element included in a resonance circuit fluctuates due to the temperature, the same oscillation frequency $f_0$ can be taken out without almost any changes in the control voltage Vt, since the amount of fluctuation can be absorbed by the variable capacitance circuit 120 (the variable capacitors 121 and 122 in the present embodiment). This will be described in the following with reference to FIG. 5 and FIG. 6.

Figure 5:
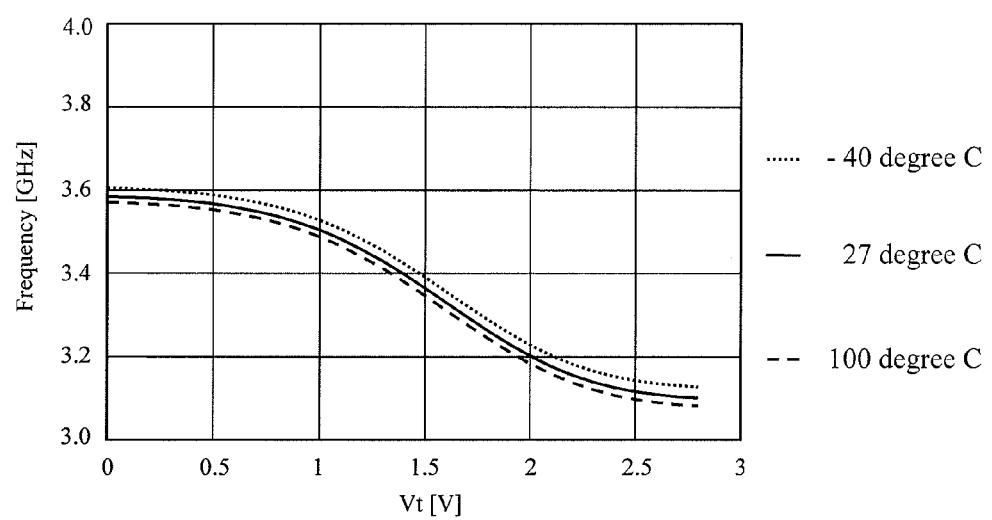
FIG. 5 is a figure showing a change in an oscillation frequency with respect to the control voltage Vt when a power-supply voltage Vdd is not compensated.
Figure 6:
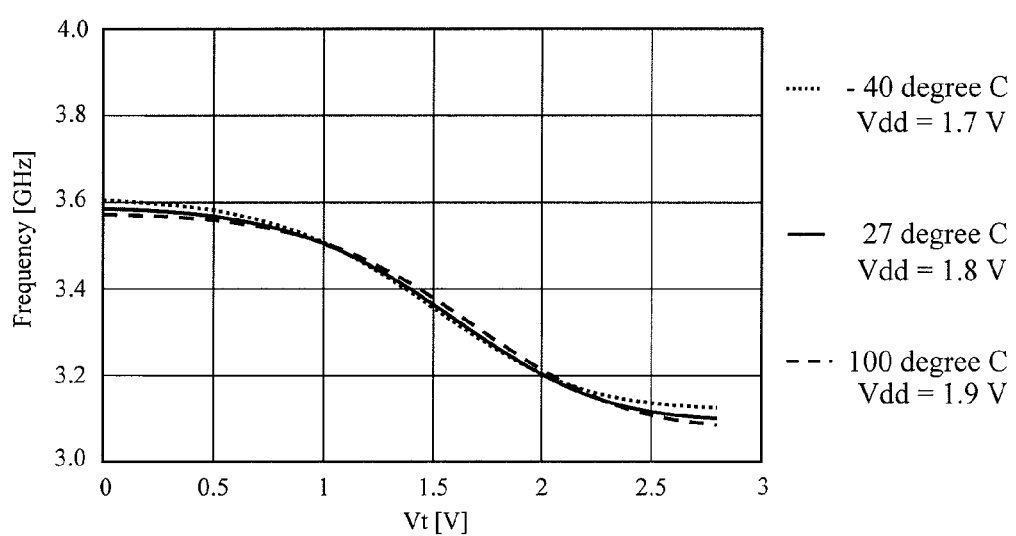
FIG. 6 is a figure showing a change in the oscillation frequency with respect to the control voltage Vt when the power-supply voltage Vdd is compensated.

FIG. 5 is a figure showing a change in the oscillation frequency $f_0$ with respect to the control voltage Vt when the power-supply voltage Vdd is not compensated. FIG. 6 is a figure showing a change in the oscillation frequency $f_0$ with respect to the control voltage Vt when the power-supply voltage Vdd is compensated. In FIGS. 5 and 6: a dotted line indicates a frequency characteristic of the oscillation frequency $f_0$ at −40° C.; a solid line indicates a frequency characteristic of the oscillation frequency $f_0$ at 27° C.; and a dashed line indicates a frequency characteristic of the oscillation frequency $f_0$ at 100° C.

As obvious from FIGS. 5 and 6, the fluctuation of the oscillation frequency $f_0$ in association with the temperature change is suppressed by compensating the power-supply voltage Vdd depending on the temperature change (the change in the inductance L in the present embodiment). Thus, the oscillation frequency $f_0$ of the local oscillation signal is held almost at a constant regardless of a temperature change.

Figure 7:
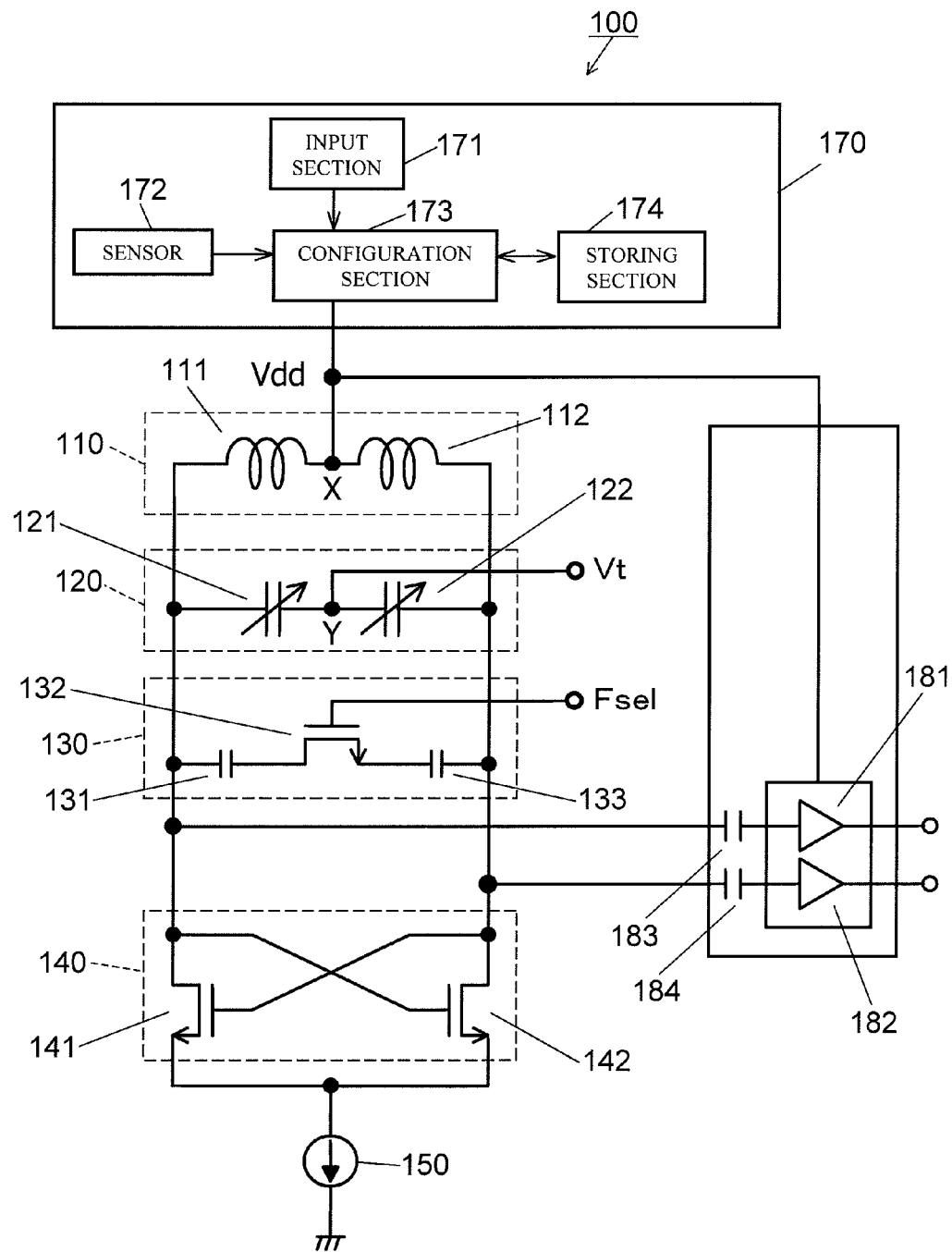
FIG. 7 is a figure showing a configurational example of the voltage-controlled oscillator 100 that includes buffer amplifiers 181 and 182.

FIG. 7 is a figure showing a configurational example of the voltage-controlled oscillator 100 that includes buffer amplifiers 181 and 182. The buffer amplifiers 181 and 182 exist in order to take out an output of the voltage-controlled oscillator 100. The buffer amplifier 181 is connected to an output terminal of the voltage-controlled oscillator 100 via a DC-cut capacitor 183. The buffer amplifier 182 is connected to the other output terminal of the voltage-controlled oscillator 100 via a DC-cut capacitor 184. In addition to the connection point X, the control section 170 applies the power-supply voltage Vdd on the buffer amplifiers 181 and 182 as a power supply. If an inverter amplifier, a differential amplifier, or the like is used as a buffer amplifier, a gain of a transistor decreases and an output power decreases when the temperature increases. Thus, a constant output power can be obtained regardless of a temperature change, by increasing the power-supply voltage Vdd in association with an increase in the temperature.

As described above, by implementing the voltage-controlled oscillator 100 according to the first embodiment, the power-supply voltage Vdd is configured to a larger value by the configuration section 174, as the temperature sensed by the sensor 173 becomes higher. As a result, an influence of the increase in the inductance of the inductors 111 and 112 with respect to the oscillation frequency $f_0$ is offset by a decrease in the capacitance value of the variable capacitors 121 and 122. The fluctuation of the oscillation frequency $f_0$ in association with a temperature change can be suppressed without almost any changes in the control voltage Vt. Therefore, the oscillation frequency $f_0$ can be held at a desired value without narrowing a variable range of the oscillation frequency $f_0$.

Described in the present embodiment is a case where the fluctuation of the oscillation frequency $f_0$ in association with a temperature change is suppressed by controlling the power-supply voltage Vdd. However, the fluctuation of the oscillation frequency $f_0$ in association with a temperature change may be suppressed by controlling both the power-supply voltage Vdd and the control voltage Vt.

Furthermore, described in the present embodiment is a configuration in which the power-supply voltage Vdd is increased in association with an increase in the temperature. However, the configuration may be one in which a control is conducted so as to decrease the power-supply voltage Vdd in association with an increase in the temperature. This is because; depending on the temperature characteristic of a resonance circuit and on capacitance characteristics of a variable capacitor (variable capacitance circuit), it is conceivable that there may be cases where it becomes necessary to decrease the power-supply voltage Vdd in association with an increase in the temperature. In such a case, when the look-up table 176 is used as described in the present embodiment, the temperature and the voltage value may be associated with one another such that the power-supply voltage Vdd becomes smaller as the temperature becomes higher.

Second Embodiment

Figure 8:
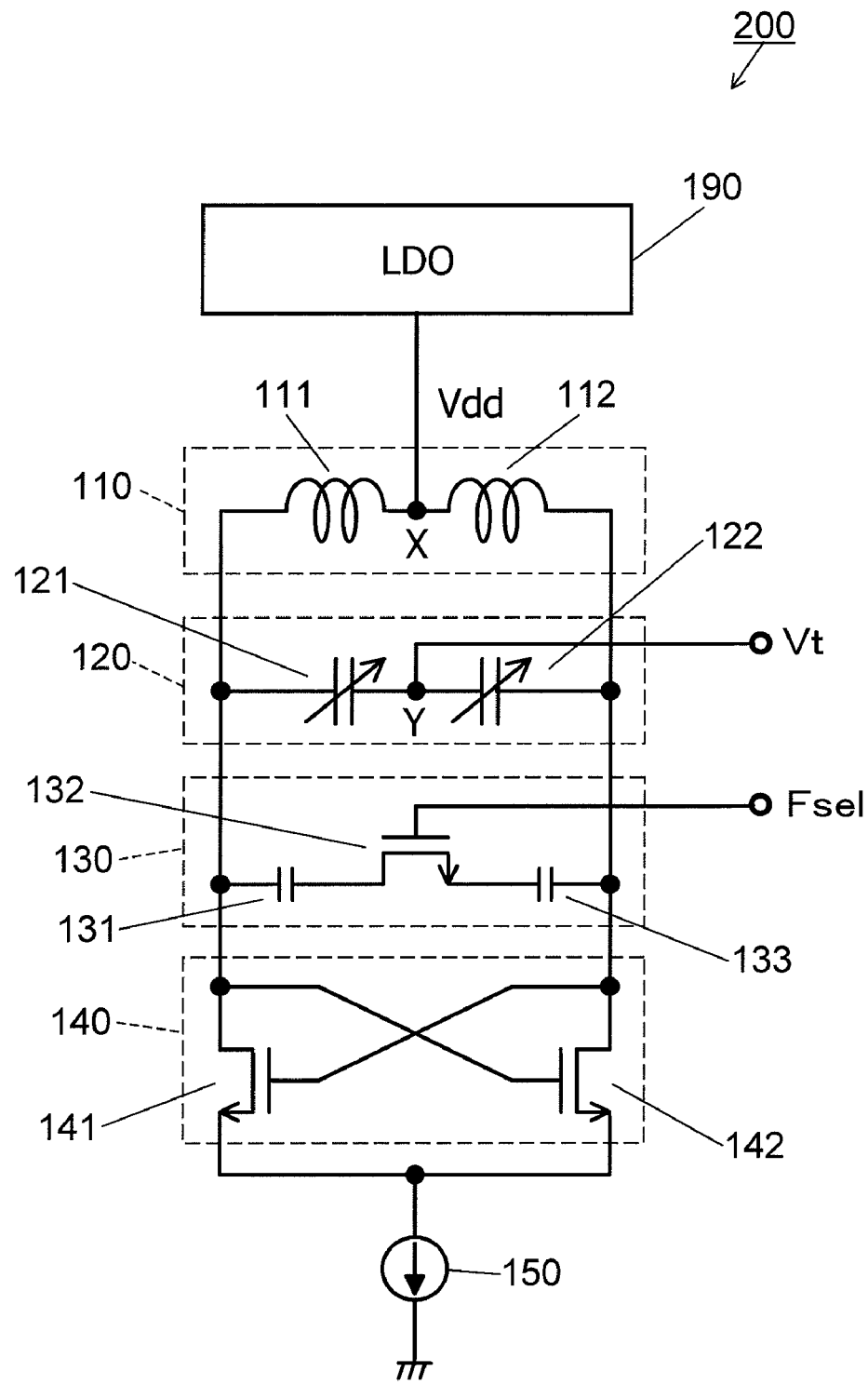
FIG. 8 is a figure showing a configurational example of a voltage-controlled oscillator 200 according to a second embodiment of the present invention.

A second embodiment of the present invention will be described in the following. FIG. 8 is a figure showing a configurational example of a voltage-controlled oscillator 200 according to the second embodiment of the present invention. The voltage-controlled oscillator 200 has a configuration similar to that of the voltage-controlled oscillator 100, except for having a low-dropout regulator (LDO) 190 instead of the control section 170 (refer FIG. 1). Thus, descriptions of the configurations that are common with the voltage-controlled oscillator 100 are omitted in the second embodiment. The buffer amplifiers 181 and 182 are omitted from FIG. 8.

Figure 9:
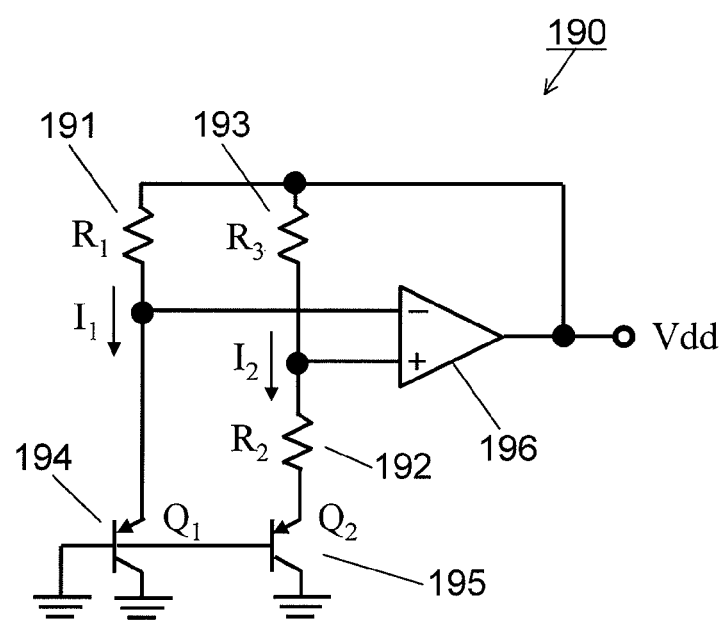
FIG. 9 is a figure showing one example of a circuit configuration of an LDO 190.

The power-supply voltage Vdd is applied to the connection point X between the inductors 111 and 112 by the low-dropout regulator 190. FIG. 9 is a figure showing one example of a circuit configuration of the low-dropout regulator 190. The low-dropout regulator 190 includes: resistances 191, 192, and 193; PNP type transistors 194 and 195; and an operational amplifier 196.

As show in FIG. 9, one end side of the resistance 191 is connected to one end side of the resistance 193 and an output terminal of the operational amplifier 196. The other end side of the resistance 191 is connected to the emitter of the PNP type transistor 194 and one of the input terminals of the operational amplifier 196. One end side of the resistance 192 is connected to the other end side of the resistance 193 and the other input terminal of the operational amplifier 196. The other end side of the resistance 192 is connected to the emitter of the PNP type transistor 195. The one end side of the resistance 193 is connected to the one end side of the resistance 191 and the output terminal of the operational amplifier 196. The other end side of the resistance 193 is connected to the one end side of the resistance 192 and the other input terminal of the operational amplifier 196. The emitter of the PNP type transistor 194 is connected to the other end side of the resistance 191 and the one of the input terminals of the operational amplifier 196. The base and the collector of the PNP type transistor 194 are grounded. The emitter of the PNP type transistor 195 is connected to the other end side of the resistance 192. The base and the collector of the PNP type transistor 195 are grounded.

The PNP type transistors 194 and 195 each have a negative temperature characteristic in which the power-supply voltage Vdd is decreased in association with an increase in the temperature. For example, for every one-degree increase in the temperature, the power-supply voltage Vdd is decreased by 2 mV. On the other hand, the resistances 191, 192, and 193 each have a positive temperature characteristic in which the power-supply voltage Vdd is increased in association with an increase in the temperature. For example, for every one-degree increase in the temperature, the power-supply voltage Vdd is increased by 10 my. Therefore, the temperature characteristic of the power-supply voltage Vdd can be determined by resistance values R1, R2, and R3 of the resistances 191, 192; and 193, and quality factors Q1 and Q2 of the PNP type transistors 194 and 195.

If it was the case with a conventional LDO, resistance values R1, R2, and R3 of the resistances 191, 192, and 193 and the quality factors Q1 and Q2 of the PNP type transistors 194 and 195 would have been configured such that the temperature characteristics of the PNP type transistors 194 and 195 and the resistances 191, 192, and 193 will offset each other. That is, to hold the power-supply voltage Vdd to a constant regardless of a temperature change. On the other hand, with the voltage-controlled oscillator 200 according to the present embodiment, the resistance values R1, R2, and R3 and the quality factors Q1 and Q2 are configured such that the power-supply voltage Vdd will increase in association with an increase in the temperature. As a result, even without almost any changes to the control voltage Vt, the oscillation frequency $f_0$ is held at a constant regardless of a temperature change. In other words, the resistance values R1, R2, and R3 and the quality factors Q1 and Q2 are configured such that, a change of the power-supply voltage Vdd by the resistances 191, 192, and 193 with respect to the temperature becomes larger than a change of the power-supply voltage Vdd by the PNP type transistors 194 and 195 with respect to the temperature.

As described above, with the voltage-controlled oscillator 200 according to the second embodiment, it is possible to control the power-supply voltage Vdd by only changing the resistances 191, 192, and 193 and the resistance values R1, R2, and R3. Therefore, a fluctuation of the oscillation frequency $f_0$ in association with a temperature change can be suppressed without newly adding a circuit configuration, by utilizing the LDO to change the power-supply voltage Vdd. The fluctuation of the oscillation frequency $f_0$ in association with a temperature change can be suppressed without almost any changes in the control voltage Vt. Therefore, the oscillation frequency $f_0$ can be held at a desired value without narrowing a variable range of the oscillation frequency $f_0$.

[Configurational Example Using the Voltage-Controlled Oscillator]

Figure 10:
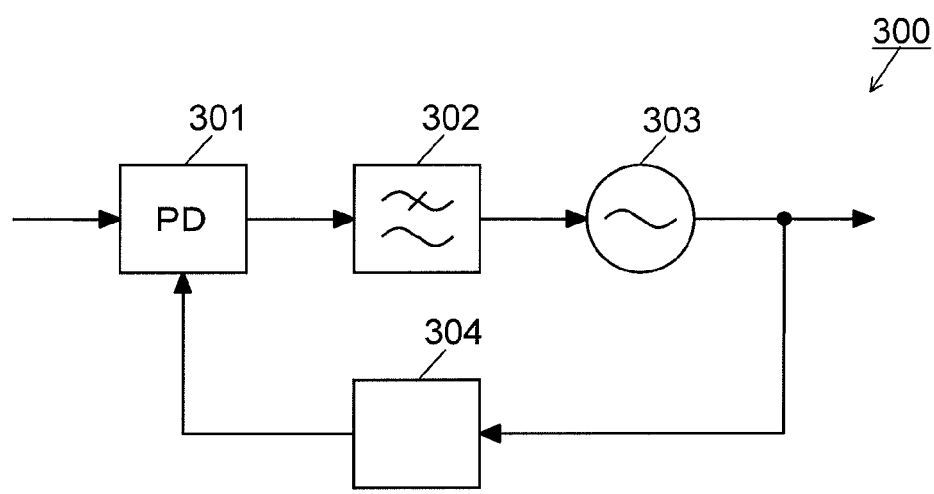
FIG. 10 is a figure showing a configuration of a PLL circuit 300 in which the voltage-controlled oscillator of the present invention is applied.

FIG. 10 is a figure showing a configurational example of a PLL circuit 300 which uses the voltage-controlled oscillators 100 and 200 according to the first and second embodiments of the present invention. As shown in FIG. 10, the PLL circuit 300 includes: a phase detector (PD) 301; a loop filter 302; a voltage-controlled oscillator 303 of the present invention (100, 200); and a frequency divider 304.

The phase detector 301 compares an inputted reference signal to a signal obtained as a result of the frequency divider 304 frequency-dividing an output signal of the voltage-controlled oscillator 303. A signal outputted from the phase detector 301 is inputted into the voltage-controlled oscillator 303 as the control voltage Vt via the loop filter 302. The voltage-controlled oscillator 303 outputs a local oscillation signal having a desired frequency based on the control voltage Vt. By means of this configuration, the PLL circuit 300 fixes (locks) a frequency that is desired. A mixer may be used instead of the frequency divider 304, or the frequency divider 304 and the mixer may be used in combination.

Figure 11:
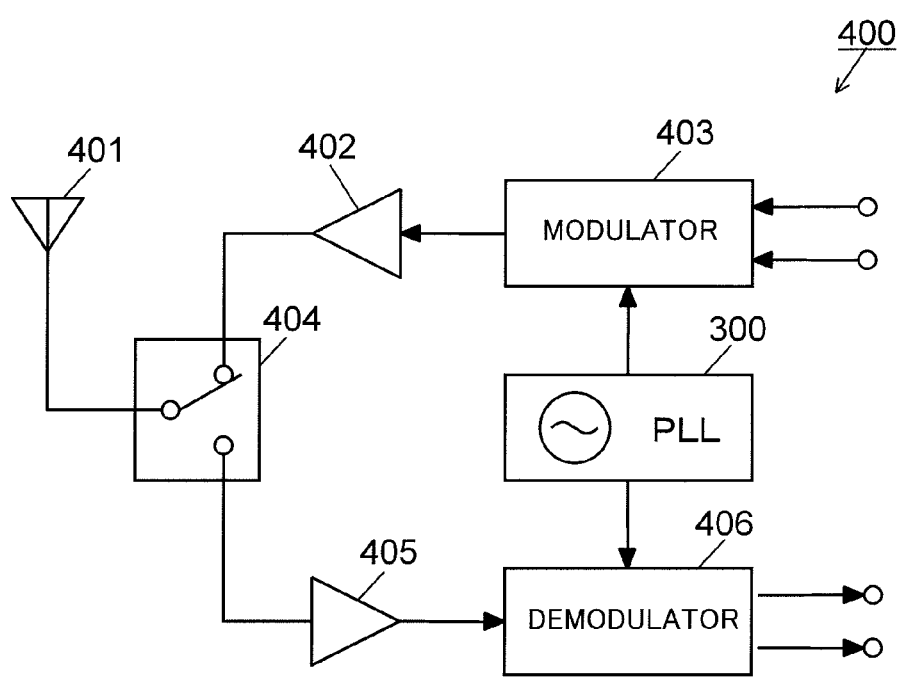
FIG. 11 is a figure showing a configuration of a wireless communication device 400 in which the PLL circuit 300 is applied.
Figure 12:
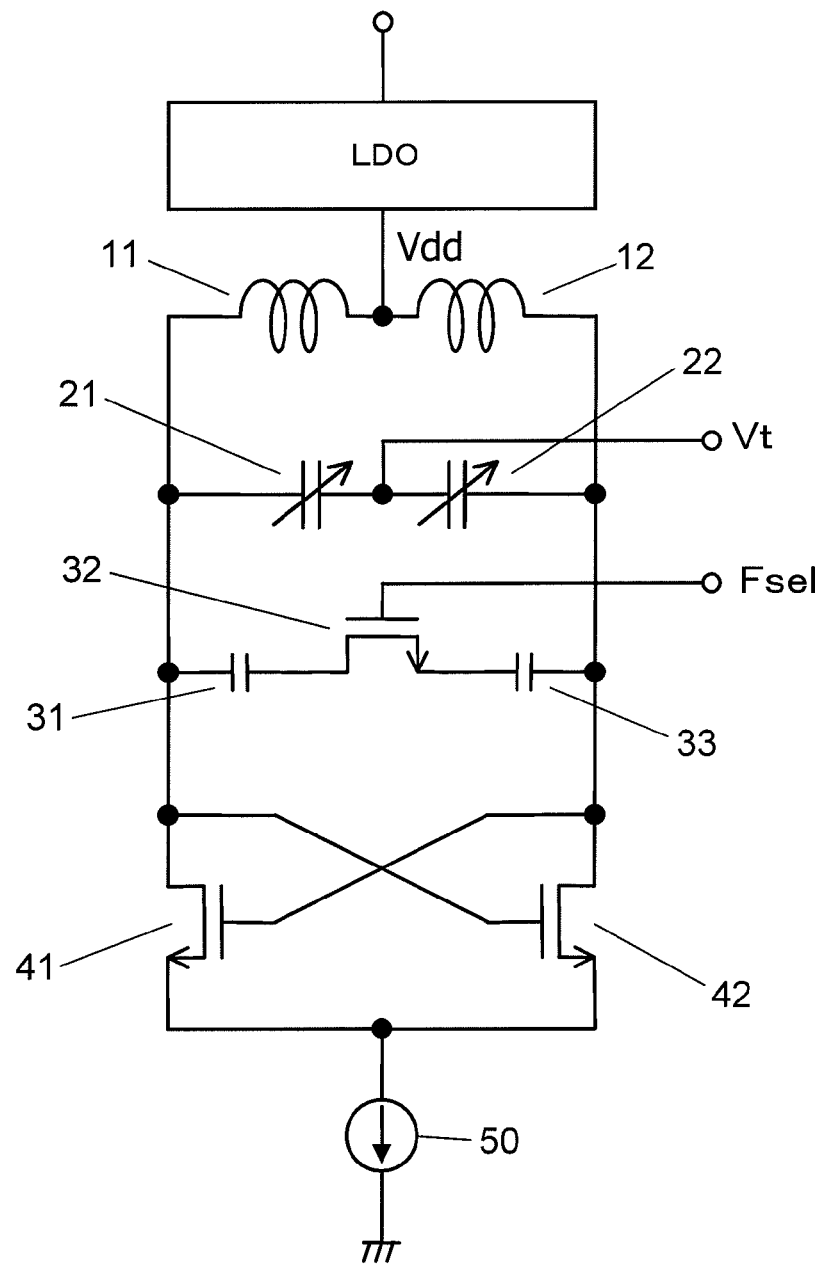
FIG. 12 is a figure showing a configuration of a conventional voltage-controlled oscillator.
Figure 13:
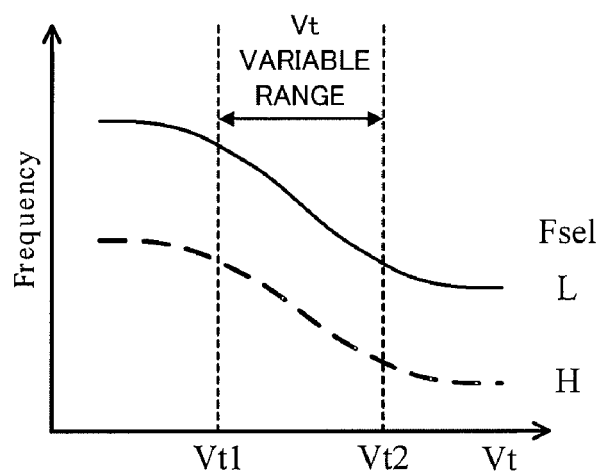
FIG. 13 is a figure showing a change in the oscillation frequency with respect to the control voltage Vt.
Figure 14A:
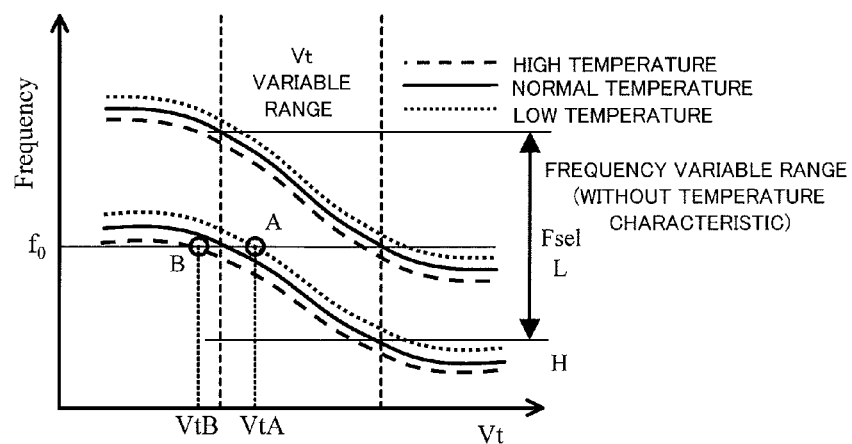
FIGS. 14A and 14B are figures showing a change in the oscillation frequency with respect to the control voltage Vt when the temperature is changed.
Figure 14B:
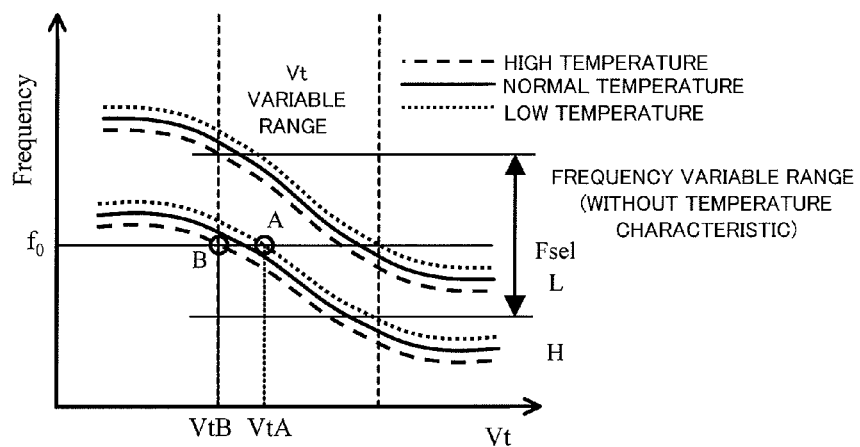

FIG. 11 is a figure showing a configurational example of a wireless communication device 400 using the PLL circuit 300. As shown in FIG. 11, the wireless communication device 400 includes: an antenna 401; a power amplifier 402; a modulator 403; a switch 404; a low noise amplifier 405; a demodulator 406; and the PLL circuit 300.

When transmitting a wireless signal, the modulator 403 modulates a desired high frequency signal outputted from the PLL circuit 300 by using a baseband modulation signal; and outputs the resulting signal. The high frequency modulation signal outputted from the modulator 403 is amplified by the power amplifier 402, and radiated from the antenna 401 via the switch 404. When receiving a wireless signal, a high frequency modulation signal received by the antenna 401 is inputted into the low noise amplifier 405 via the switch 404, amplified, and inputted into the demodulator 406. The demodulator 406 demodulates the inputted high frequency modulation signal into a baseband modulation signal by using the high frequency signal outputted from the PLL circuit 300. A plurality of the PLL circuits 300 may be used on a transmission side and a reception side. Furthermore, the PLL circuit 300 may also function as a modulator.

Here, described is a case where the voltage-controlled oscillator 100 or 200 is applied in the PLL circuit 300. However the voltage-controlled oscillator 100 or 200 may be applied in an FLL circuit.

The voltage-controlled oscillator according to the present invention is applicable for generation of a local oscillation signal of a wireless communication device and the like.

While the invention has been described in detail, the foregoing description is in all aspects illustrative and not restrictive. It is understood that numerous other modifications and variations can be devised without departing from the scope of the invention.

What is claimed is:

1. A voltage-controlled oscillator that generates a local oscillation signal, the voltage-controlled oscillator comprising:
    an inductor circuit including inductors that are connected in series;
    a variable capacitance circuit including variable capacitors that are connected in series, each of the variable capacitors changing a capacitance value depending on a difference in electrical potentials between both terminals of each of the variable capacitors;
    at least one capacitance switching circuit that includes a capacitive element and a switching element;
    a negative resistance circuit; and
    a control section that applies a power-supply voltage to a connection point between the inductors, wherein
    the inductor circuit, the variable capacitance circuit, the at least one capacitance switching circuit, and the negative resistance circuit are parallelly connected to each other,
    a control voltage is applied to a connection point between the variable capacitors and a control signal is inputted into the capacitance switching circuit,
    the control section changes the power-supply voltage in association with a temperature change, so as to maintain the oscillation frequency of the local oscillation signal at a constant regardless of a temperature change, and
    the control section includes:
        a storing section that stores a temperature and a voltage value in association with one another;
        a sensor that senses a temperature; and
        a configuration section, which retrieves, from the storing section, a voltage value that corresponds to a temperature that is sensed by the sensor, and which configures the power-supply voltage to be the voltage value.

2. The voltage-controlled oscillator according to claim 1, wherein the temperature and the voltage value stored in the storing section are configured such that the voltage value becomes larger as the temperature becomes higher.

3. A voltage-controlled oscillator that generates a local oscillation signal, the voltage-controlled oscillator comprising:
   an inductor circuit including inductors that are connected in series;
   a variable capacitance circuit including variable capacitors that are connected in series, each of the variable capacitors changing a capacitance value depending on a difference in electrical potentials between both terminals of each of the variable capacitors;
   at least one capacitance switching circuit that includes a capacitive element and a switching element;
   a negative resistance circuit; and
   a control section that applies a power-supply voltage to a connection point between the inductors, wherein
   the inductor circuit, the variable capacitance circuit, the at least one capacitance switching circuit, and the negative resistance circuit are parallelly connected to each other,
   a control voltage is applied to a connection point between the variable capacitors and a control signal is inputted into the capacitance switching circuit,
   the control section changes the power-supply voltage in association with a temperature change, so as to maintain the oscillation frequency of the local oscillation signal at a constant regardless of a temperature change,
   the control section is a low-dropout regulator that includes a resistance and a transistor, and
   a resistance value of the resistance is configured such that the oscillation frequency is maintained at a constant regardless of a temperature change.

4. A voltage-controlled oscillator that generates a local oscillation signal, the voltage-controlled oscillator comprising:
   an inductor circuit including inductors that are connected in series;
   a variable capacitance circuit including variable capacitors that are connected in series, each of the variable capacitors changing a capacitance value depending on a difference in electrical potentials between both terminals of each of the variable capacitors;
   at least one capacitance switching circuit that includes a capacitive element and a switching element;
   a negative resistance circuit; and
   a control section that applies a power-supply voltage to a connection point between the inductors, wherein
   the inductor circuit, the variable capacitance circuit, the at least one capacitance switching circuit, and the negative resistance circuit are parallelly connected to each other,
   a control voltage is applied to a connection point between the variable capacitors and a control signal is inputted into the capacitance switching circuit,
   the control section changes the power-supply voltage in association with a temperature change, so as to maintain the oscillation frequency of the local oscillation signal at a constant regardless of a temperature change,
   the voltage-controlled oscillator further comprises a buffer amplifier that takes out an output of the voltage-controlled oscillator, and
   the control section applies, in addition to the connection point between the inductors, the power-supply voltage to the buffer amplifier.

* * * * *